US006827824B1

(12) United States Patent
Blalock et al.

(10) Patent No.: US 6,827,824 B1
(45) Date of Patent: Dec. 7, 2004

(54) ENHANCED COLLIMATED DEPOSITION

(75) Inventors: Guy Blalock, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1587 days.

(21) Appl. No.: 08/631,465

(22) Filed: Apr. 12, 1996

(51) Int. Cl.$^7$ ............................................. C23C 14/35
(52) U.S. Cl. ........................ 204/192.12; 204/298.06; 204/298.16; 204/298.11; 204/298.26
(58) Field of Search ..................... 204/192.12, 298.02, 204/298.05, 298.06, 298.16, 298.11, 298.26; 427/586, 523, 298.11, 298.26

(56) References Cited

U.S. PATENT DOCUMENTS

| | | | |
|---|---|---|---|
| 3,583,361 A | * 6/1971 | Laudel, Jr. ................. | 118/723 |
| 3,962,988 A | * 6/1976 | Murayama et al. .......... | 118/723 |
| 4,059,761 A |  11/1977 | Dawson ..................... | 250/287 |
| 4,123,316 A |  10/1978 | Tsuchimoto ............. | 156/643.1 |
| 4,579,750 A | * 4/1986 | Bowen et al. .............. | 427/586 |
| 4,676,194 A | * 6/1987 | Satou et al. ................ | 118/720 |
| 4,901,667 A |   2/1990 | Suzuki et al. .............. | 118/719 |
| 4,925,542 A |   5/1990 | Kidd ......................... | 427/531 |
| 4,981,568 A | * 1/1991 | Taranko et al. ............. | 427/474 |
| 5,089,442 A |   2/1992 | Olmer ....................... | 432/235 |
| 5,100,526 A | * 3/1992 | Ito ........................... | 204/298.05 |
| 5,110,435 A | * 5/1992 | Haberland .................. | 427/523 |
| 5,117,432 A |   5/1992 | Nilsen ........................ | 372/5 |
| 5,128,173 A | * 7/1992 | Kugan ....................... | 427/530 |
| 5,178,739 A | * 1/1993 | Barnes et al. ............ | 204/298.06 |
| 5,180,918 A |   1/1993 | Isobe ...................... | 250/492.2 |
| 5,188,671 A |   2/1993 | Zinch et al. ................ | 118/715 |
| 5,290,358 A |   3/1994 | Rubloff et al. ............. | 118/715 |
| 5,302,266 A | * 4/1994 | Grabarz et al. .......... | 204/192.12 |
| 5,382,457 A |   1/1995 | Coombe ..................... | 427/596 |
| 5,431,799 A | * 7/1995 | Mosely et al. .......... | 204/298.06 |

FOREIGN PATENT DOCUMENTS

| | | | | |
|---|---|---|---|---|
| EP | 0288608 | * | 11/1988 | ............ 204/298.05 |
| EP | 0 288 608 | * | 11/1988 | ............ 204/298.05 |
| JP | 63-203767 | * | 8/1988 | ............ 204/298.05 |
| JP | 5-255859 | * | 10/1993 | ............ 204/298.02 |
| JP | 5-311419 | * | 11/1993 | ............ 204/298.11 |

* cited by examiner

*Primary Examiner*—Rodney G. McDonald
(74) *Attorney, Agent, or Firm*—Fletcher Yoder

(57) ABSTRACT

An apparatus for film deposition onto a substrate from a source of target particles including a plasma generator creating a plasma that isotropically accelerates the target particles towards the substrate. A secondary ionizer creates a secondary ionization zone between the plasma and the substrate support. The isotropically accelerated target particles are ionized as they pass through the secondary ionization zone. A static field generator creates a static field between the secondary ionization zone and the substrate accelerating the ionized target particles along a substantially collimated trajectory perpendicular to the substrate. Optionally, a collimator is included between the secondary ionization zone and the substrate and biased to focus and accelerate the collimated target particles.

31 Claims, 7 Drawing Sheets

ENHANCED COLLIMATED DEPOSITION

BACKGROUND OF THE INVENTION

1. Field of the Invention

The present invention relates, in general, to an apparatus and method for film deposition, and, more particularly, to an apparatus and method for filling high aspect ratio gaps and vias with collimated particulate streams.

2. Statement of the Problem

Integrated circuit technology has advanced through continuing improvements in photolithographic processing so that smaller and smaller features can be patterned onto the surface of a substrate. Spaces or gaps exist between these patterned features. Integrated circuit surfaces also contain trench or via structures extending down into the surface. The lateral dimension of such structures is hereafter referred to as the width of the gap, trench or via; the vertical dimension of such structures is referred to as the depth. The aspect ratio is the ratio of depth to width.

The smaller features, with smaller spaces between features, result in high aspect ratio gaps, trenches and vias. These high aspect ratio structures must be filled with an appropriate material before continued processing. Deposition onto trench and via structures is commonly practiced at several stages in the fabrication of semiconductor devices and interconnections. Most often the objective is to provide highly conformal films or void-free (and preferably seam-free) filling.

High aspect ratio structures are difficult to fill due to "shadowing" effects wherein some particles traveling in random or uncontrolled directions (hereinafter "isotropic" particles) strike the sidewalls of the via at an angle thus causing a film growth on the sidewalls. The sidewall film growth eventually closes off the via before it is filled. This problem is acute in the case of multi-layer metal (MLM) designs where high aspect ratio vias are etched into a dielectric layer and metal must be deposited to fill the via. Another problem in MLM designs is that dielectric must be deposited in high aspect ratio features after each metal layer is formed and patterned before a subsequent metal layer can be formed and patterned.

Low pressure chemical vapor deposition (LPCVD) and plasma enhanced chemical vapor deposition (PECVD) are widely used to provide conformal deposition of thin films over three dimensional features. CVD techniques are successfully used for moderate aspect ratio structures where sidewall deposition does not close off the structure before it is filled. However, most CVD systems inherently deposit on the sidewalls at the same rate as at the bottom of a trench or via, which is unacceptable for higher aspect ratio structures. CVD deposition techniques must be altered to preferentially deposit at the bottom of three-dimensional structures. Further, not all materials can be adapted to CVD deposition. In particular, few practical systems for CVD deposition of metal films exist.

Metal film deposition is widely performed by physical deposition techniques (i.e., evaporation and sputter-deposition). In the case of via filling, it is desirable to deposit films that form preferentially at the bottom of the via rather than on the sidewalls of the via. Physical deposition techniques, however, produce streams of particles that are isotropic (i.e., not highly directional). Hence, physical vapor deposition are typically limited to low aspect ratio structures.

Recently, collimated sputtering has been attempted using lattice-shaped collimators to block particles traveling towards the substrate at unacceptable angles. One such structure is shown in U.S. Pat. No. 4,717,462 issued to Homma et al. on Jan. 5, 1988. The collimators are high aspect ratio tunnels that allow only particles having acceptable trajectories to pass through. The remaining particles impact and deposit on the sidewalls of the collimator. A typical distribution of trajectories from a sputter target includes less than 50% of the particles having a trajectory of $90\pm5°$ with respect to the substrate surface.

Hence, most of the particles deposit onto the collimator rather than the substrate. This results in low deposition rates and a high degree of particulate contamination from the material deposited on the collimator sidewalls. Moreover, collimators provide limited directionality as the particles leaving the collimator still have $\pm5°$ variation in their trajectories. A need exists for a high deposition rate, low particulate collimator for film deposition.

U.S. Pat. No. 4,925,542 issued to Kidd on May 15, 1990 describes a plasma deposition apparatus that uses an electrostatic field to accelerate ions from the plasma longitudinally towards a substrate. A grounded screen isolates the plasma potential from the substrate potential to allow the electrostatic field to be established. Importantly, the grounded screen was not used to collimate the particulate stream, only to electrically isolate the plasma from the substrate. Also, the Kidd deposition apparatus could only impart directional acceleration force to particles that remained ionized over the entire distance from the target to the substrate. Because ions tend to recombine with charged particles in the plasma and neutralize quickly, the electrostatic acceleration could only collimate a fraction of the sputtered particles.

Step coverage and filling of high aspect ratio structures is a continuing problem in the semiconductor industry. What is needed is an apparatus and method for filling high aspect ratio gaps and vias with collimated particulate streams.

SUMMARY OF THE INVENTION

The present invention involves an apparatus for film deposition onto a substrate from a non-collimated source of target particles. A secondary ionizer creates a secondary ionization zone between the plasma and the substrate support. The isotropically accelerated target particles are ionized as they pass through the secondary ionization zone. In one embodiment a static field generator creates a static field between the secondary ionization zone and the substrate accelerating the ionized target particles along a substantially collimated trajectory perpendicular to the substrate. Optionally, a collimator is included between the secondary ionization zone and the substrate and biased to focus and accelerate the collimated target particles.

DETAILED DESCRIPTION OF THE DRAWINGS

1. Overview

The apparatus and method in accordance with the present invention provide collimated streams of particles for film depositions. Unlike ion beam apparatus, the present invention involves deposition of thin films over a wide area such as the entire surface of a wafer. The particular embodiments used herein to illustrate the present invention are described with reference to a sputtering apparatus, but it should be readily apparent that other film deposition techniques such as evaporation, E-gun, and CVD, can be adapted to use the method and apparatus in accordance with the present invention.

In the specific examples described herein the sputter deposition deposits metal onto a semiconductor surface. While this is a common and useful application for the teachings of the present invention, it is to be expressly understood that the present invention applies to any type of deposition including dielectric, semiconductor, silicide, other metal films, and the like.

An essential problem in creating collimated streams of particles during a film deposition is that when particles are removed or extracted from a source, also called a target, they typically have isotropic distribution of trajectories. In other words, the particles move randomly away from the target toward the substrate or according to some non-collimated distribution of trajectories. In order to provide a collimated stream, the particles must be given longitudinal energy so that they travel straight toward the substrate.

If the target particles are allowed to travel a sufficient distance (i.e., several feet) those particles reaching the surface of a substrate will be relatively collimated. However, only a small percentage of the particles that have left the target will reach the substrate in such a system. In accordance with the present invention, the particles leaving the substrate are redirected and given longitudinal energy to create the collimated streams. The several embodiments shown and described herein illustrate basic modifications of the teaching of the present invention. Other modifications of the apparatus of the preferred embodiments will be apparent to those of skill in the art and are considered equivalent to the embodiments shown and described herein.

2. Secondary Ionization with DC Collimating Field

Figure 1:
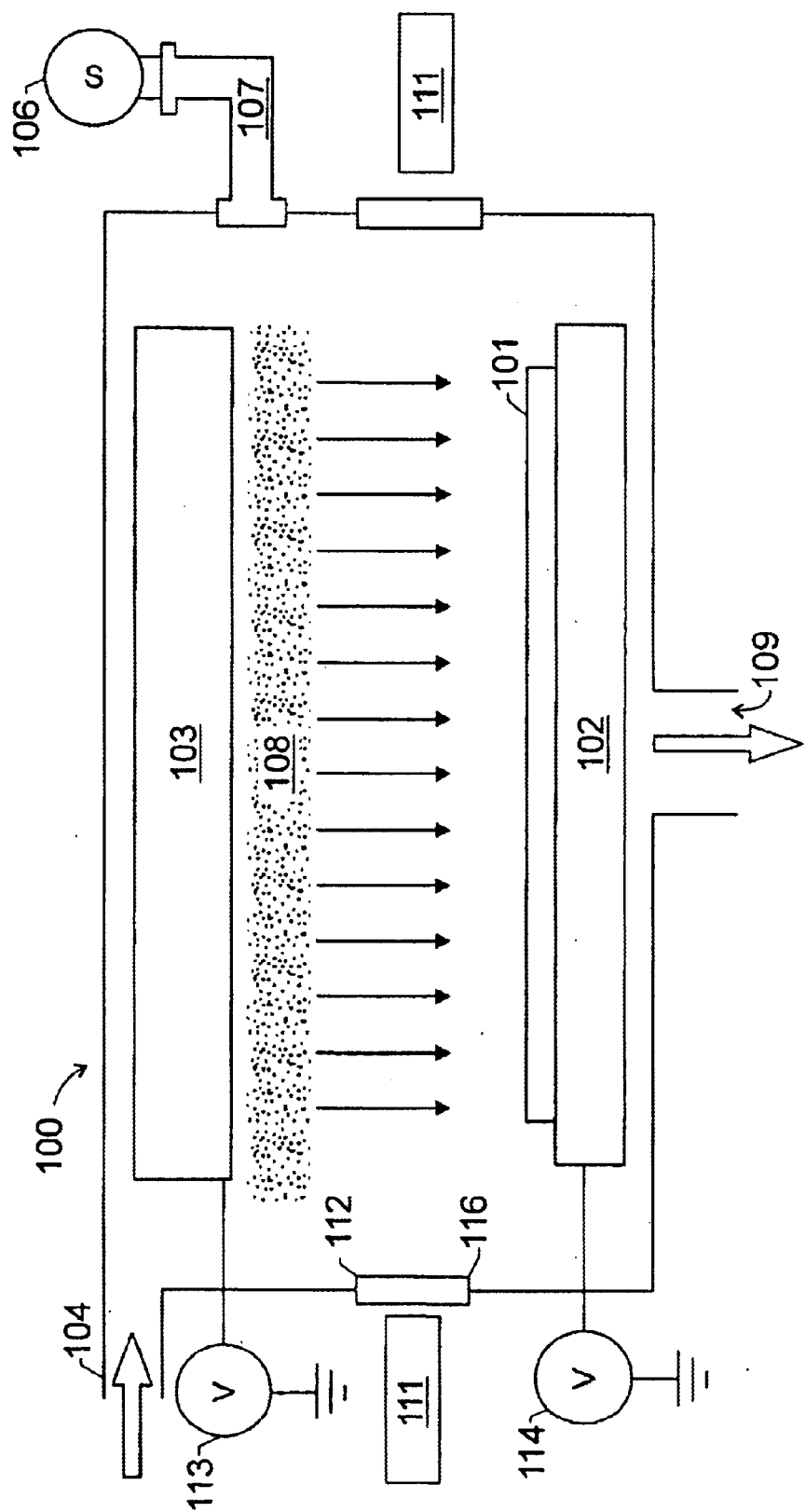
FIG. 1 illustrates in cross-section form a first embodiment in accordance with the present invention.

FIG. 1 illustrates a first embodiment sputtering apparatus in accordance with the present invention. Apparatus 100 is shown as a single wafer sputter deposition apparatus. However, the teachings of the present invention could be readily applied to a multiple wafer sputtering apparatus. Substrate 101 is a semiconductor substrate that may include one or more surface layers and patterned features formed thereon. Substrate 101 rests on a support 102 at one end of apparatus 100.

As in conventional sputter apparatus, a target 103 comprising atoms that are to be deposited on substrate 101 is provided at an opposite end of sputter apparatus 100. Process gasses are supplied via port 104 and fill the space between target 103 and substrate 101. Ordinarily, apparatus 100 is maintained at a low pressure by a vacuum pump (not shown) coupled to an outlet port 109.

A high frequency or microwave energy source 106 is coupled via wave guide 107 to supply high frequency energy into sputter apparatus 100 in a region near target 103. The application of high frequency energy from source 106 causes a plasma to be generated in region 108 by electron cyclotron residence (ECRc heating. The plasma typically comprises the process gasses that are ionized by the ECR heating to a very high energy state giving individual ions in plasma 108 significant kinetic energy. Process gasses provided through port 104 typically comprise an inert gas in a sputtering apparatus such as argon. In a reactive sputtering or CVD system, process gasses would include inert gasses along with components that would react with the materials sputtered from target 103 to create films that deposit on substrate 101.

The excited argon atoms in plasma 108 strike the surface of target 103 with great energy causing atoms on the surface of target 103 to be ejected into plasma 108. Some of the atoms ejected from target 103 have sufficient energy to travel through the low-pressure environment to substrate 101 where they deposit to form a film. Other of the ejected atoms have insufficient energy and are ionized in plasma 108. These atoms are often attracted back to target 103 by a negative bias applied to target 103 by supply 113. These atoms return to target 103 and re-sputter additional atoms from target 103. So long as the plasma 108 is sustained, target atoms continue to reach surface 101 in a conventional sputter apparatus.

Voltage supply 114 is coupled to support 102 to provide a large negative bias to wafer 101 during the sputter deposition. This negative bias creates a field between substrate 101 and plasma 108 that tends to draw out positive ions from plasma 108. The DC field created by voltage source 114 only acts upon ionized atoms from target 103 which at any point in time represent only a portion of the atoms ejected from target 103. The ionized target atoms in plasma 108 are given some degree of directionality by bias supply 114 improving the properties of the film deposited using a supply 114.

However, because the field created by bias supply 114 only affects ionized target atoms, the improvement in directionality is limited. This is particularly true in the case of metal target particles which recombine quickly as they leave the plasma 108 to form neutral metal particles. Once neutralized, the neutral target atoms in a conventional sputter apparatus are not affected by static electric or magnetic fields in sputter apparatus 100 and thus continue on their original trajectory toward substrate 101.

An important feature of the apparatus and method in accordance with the present invention is the introduction of secondary ionization means 111. Secondary ionization means creates a secondary ionization zone between plasma 108 and the surface of substrate 101. Secondary ionizer 111 re-ionizes the target atoms thus allowing them to be accelerated and steered using static electric and/or magnetic fields. In the embodiment shown in FIG. 1, the static electric field created by supply 114 will create a longitudinal acceleration of the ionized target atoms once they have passed through the secondary ionization zone.

In a preferred embodiment, ionizers 111 provide optical energy having sufficient power and a selected wave length to ionize target atoms. The optical energy preferably has a wave tuned to selectively ionize the target atoms. The secondary ionizers 111 may provide a wide bandwidth ionization using ultra violet on other optical energy. In a preferred embodiment, secondary ionizers 111 are lasers having a narrow bandwidth and high power. Secondary ionizers 111 supply optical energy through quartz windows 112 in the side of sputter apparatus 100.

In this first embodiment shown in FIG. 1, a collimated stream is produced by re-ionizing the target atoms in a region between plasma 108 and substrate 101. A DC static field is supplied between plasma 108 and substrate 101 by bias supply 114. The DC field accelerates the re-ionized target, atoms created by secondary ionization sources 111, thereby creating a directional particulate stream traveling perpendicular to the surface of substrate 101.

3. Multiple Secondary Ionization Zones

Figure 2:
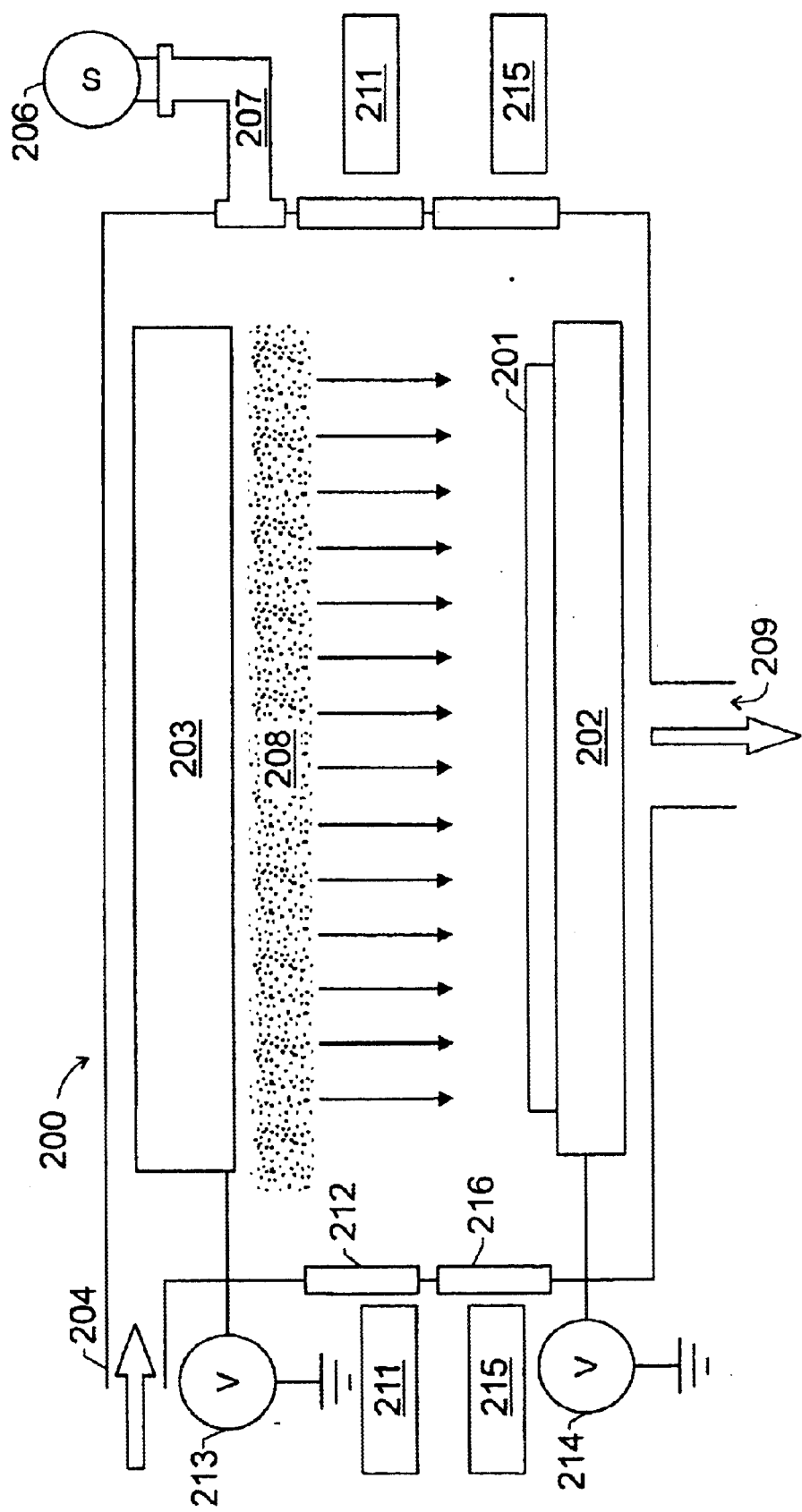
FIG. 2 illustrates in cross-section form a second embodiment in accordance with the present invention.

The longer a target atom can be kept ionized the greater steering capability is provided. In FIG. 2, multiple levels of secondary ionizers such as ionizers 211 and 215 are provided to increase the amount of time that each target atom remains ionized. In FIG. 2 common elements such as wafer support 202, substrate 201, target 203, gas ports 204 and 209, target bias 213, substrate bias 214, and high-frequency energy source 206 and 207 operate in a manner similar to that described for analogous components in FIG. 1. As plasma 208 extracts target particles from target 203 they may or may not be initially ionized in plasma 208. Atoms having sufficient momentum pass out of plasma 208 having non-collimated or isotropic trajectories. Ionizer 211 operating through windows 212 ionizes the target atoms as they intersect the path of ionizer 211. These atoms are accelerated perpendicularly to substrate 201 by the presence of the DC fields created by substrate bias 214. The target atoms are once again ionized by ionizers 215 operating through windows 216. Once ionized again, the DC field created by substrate bias 214 can further accelerate and provide greater lateral momentum to the target atoms.

Although two secondary ionizers 211 and 215 are shown in FIG. 2, it should be apparent that any number of secondary ionizers may be provided in a practical apparatus. Due to the relatively short lifetime of metal ions, it is believed that several levels of secondary ionization in the travel path between plasma 208 and substrate 201 may be appropriate and desirable to provide improved directionality to particles striking perpendicularly on the surface of substrate 201. The remaining embodiments described herein do not show multiple ionizers 211 and 215, however, it should be understood that multiple ionizers can be incorporated with any of the variations described herein.

4. Secondary Ionization with Electrostatic Collimator

Figure 3:
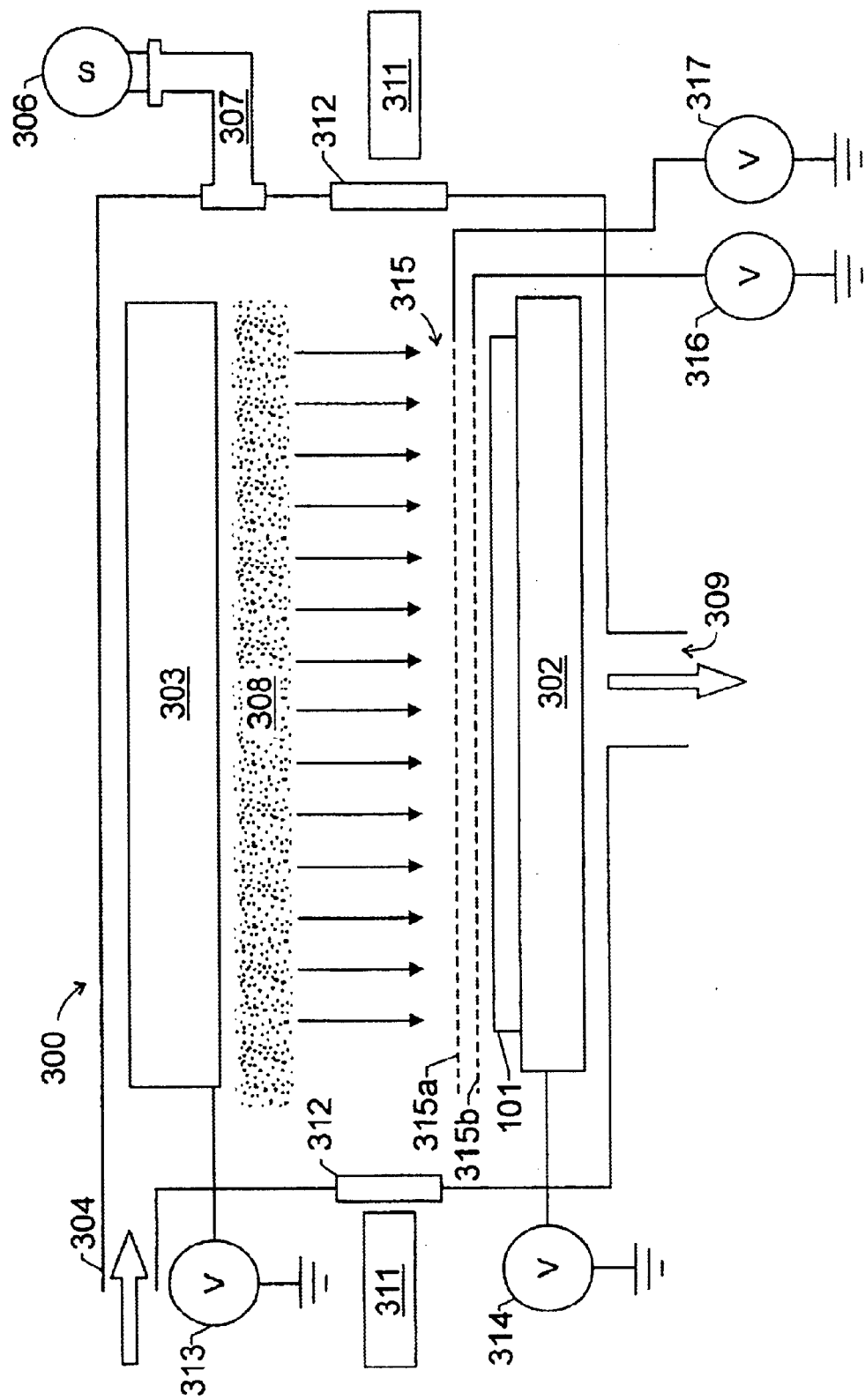
FIG. 3 illustrates in cross-section form a third embodiment in accordance with the present invention.

FIG. 3 illustrates a third embodiment in accordance with the present invention. In the embodiments shown in FIG. 1 and FIG. 2, collimation was provided by a DC field created between plasma 108 or 208 and substrate 101 or 201. As set out hereinbefore, collimator structures are known and used in connection with sputtering devices in order to further improve collimation of particle streams. In the past, collimators have been mechanical devices that physically block particles having unacceptable trajectories. This physical blocking resulted in reduced deposition rate and particulate contamination within the sputter chamber.

In the embodiment of the present invention shown in FIG. 3, an electrostatic "grid" collimator 315 is provided. Electrostatic grid collimator 315 comprises grids 315a and 315b that are differentially charged by power supplies 316 and 317 to opposite polarities. Voltage output of power supplies 316 and 317 are set to attract and accelerate target ions as they move through the grid in a manner that focuses their trajectories toward the substrate. Differential grids of this type are known and used for ion beam etching. Details of the preferred electrostatic collimation in accordance with the present invention are described hereinafter in reference to FIG. 7–FIG. 8.

Apparatus 300 includes a substrate 301, substrate support 302, gas supply port 304 and outlet port 309, target 303, and high-frequency energy supply 306 and waveguide 307 that are analogous to similar components described in reference to FIG. 1 and FIG. 2. Secondary ionizers 311 operate through windows 312 to create a secondary ionization zone between plasma 308 and electrostatic collimator 315. The ionized atoms pass through electrostatic collimator 315 except for a small percentage of atoms that deposit on collimator 315.

Electrostatic collimator 315 may be formed as a mesh, screen, or a sheet of conductive material having holes of any size or shape formed therein. Preferably, the openings in electrostatic collimator 315 are large compared to the surface area that is blocked by electrostatic collimator 315. Alternatively, a conventional honeycomb collimating structure can be provided using a conductive material. The honeycomb structure provided may of the advantages of a conventional collimator in that with high aspect ratio openings typical of a honeycomb collimator structure, a high degree of collimation is provided.

In accordance with the present invention, by coupling a charge to electrostatic grid collimator 315, ionized particles are steered through the collimator rather than simply blocked by the collimator. This results in a higher degree of material passing through the collimator thus providing improved deposition rates and reduced particulate deposition on electrostatic collimator 315.

While the electrostatic grid collimator of the preferred embodiment is described in conjunction with secondary ionization, it should be understood that electrostatic collimation without secondary ionization is also useful. Particles sputtered from target 303 have some inherent level of ionization caused by the sputter process. Hence, electrostatic collimator 315 will function to collimate the sputtered ions even where secondary ionization is not supplied. It is to be expressly understood that the present invention contemplates use of the electrostatic collimator 315 and equivalents thereof alone or in conjunction with secondary ionization.

5. Secondary Ionization with Static Magnetic Field Collimator

Figure 4:
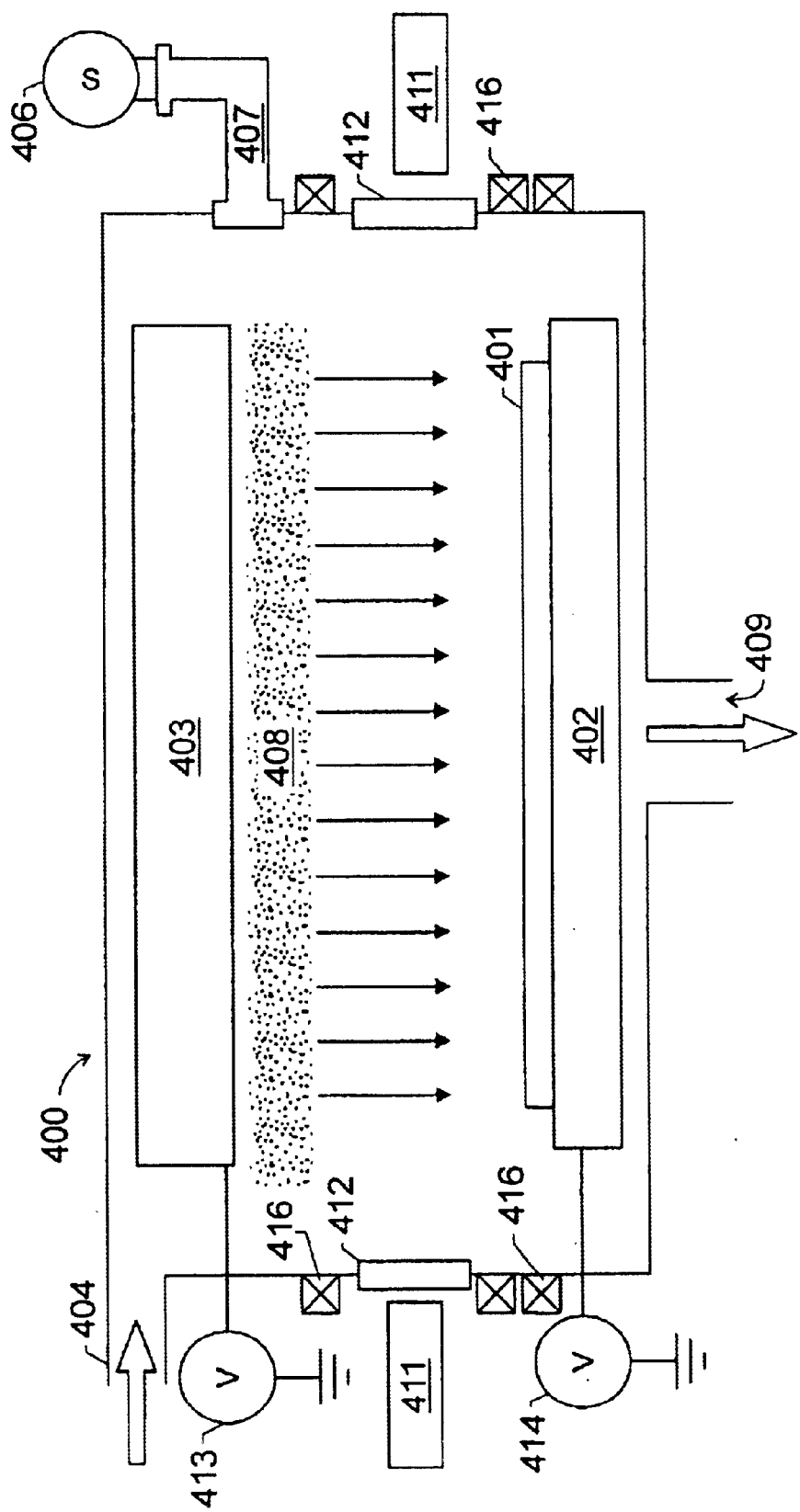
FIG. 4 illustrates in cross-section form a fourth embodiment in accordance with the present invention.

FIG. 4 illustrates a fourth embodiment in accordance with the present invention. In the fourth embodiment collimation is provided by a combination of DC electrostatic field and a static magnetic field provided by coils 416. Coils 416 are wrapped about deposition apparatus 400 to form a solenoid. A DC current is passed through coils 416 to create a static magnetic field having field lines longitudinally aligned between plasma 408 and substrate 401. Although a magnetic field cannot influence neutral atoms, the addition of secondary ionizers 411 operating through windows 412 in accordance with the present invention creates ionized target atoms in the static magnetic field created by coils 416. The longitudinal force lines of the static magnetic field apply a longitudinal momentum to the ionized target atoms creating a collimated stream between plasma 408 and substrate 401.

The components of deposition apparatus 400 in accordance with the present invention that appear similar to analogous components in FIG. 1–FIG. 3 are not described in greater detail hereinafter as they operate and are structured in a similar manner to that described hereinbefore.

6. Secondary Ionization after Collimation

Figure 5:
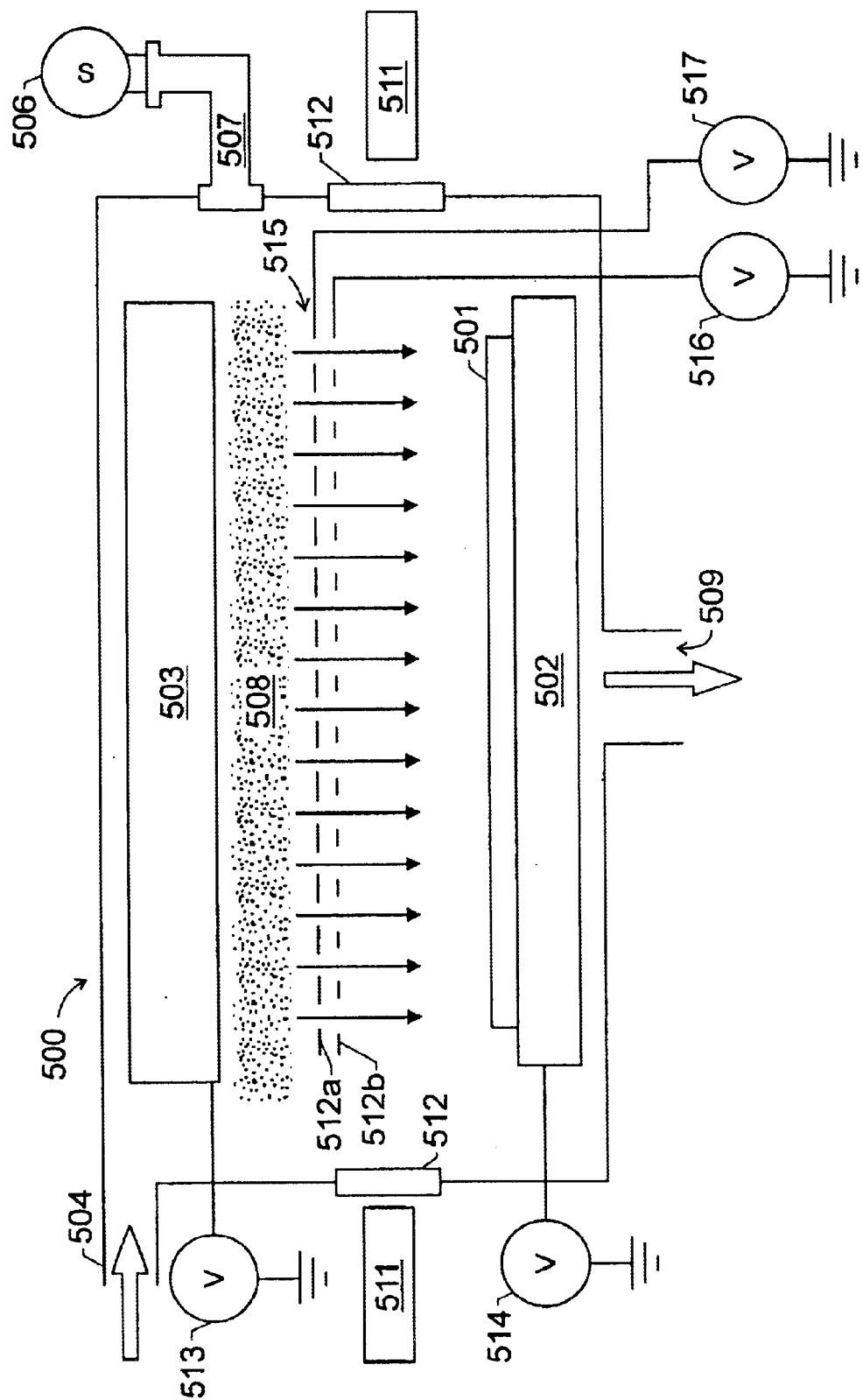
FIG. 5 illustrates in cross-section form a fifth embodiment in accordance with the present invention.

FIG. 5 illustrates a fifth embodiment in accordance with the present invention using an electrostatic collimator 515 positioned between plasma 508 and the secondary ionization zone created by ionizers 511. In FIG. 5, ionized target atoms in plasma 508 are extracted from plasma 508 by physical momentum created by the plasma. Electrostatic collimator 515 is provided with a bias which will steer and collimate the ions before they recombine to form neutral particles.

Hence, the particles exiting electrostatic collimator 515 are initially collimated as they enter the secondary ionization zone provided by ionizers 511. The secondary ionization zone, as in the other embodiments, ionized or reionized the target atoms. The reionized target atoms are further laterally accelerated and collimated by substrate bias 514 creating a DC field.

7. Optical Ionization Structure

Figure 6:
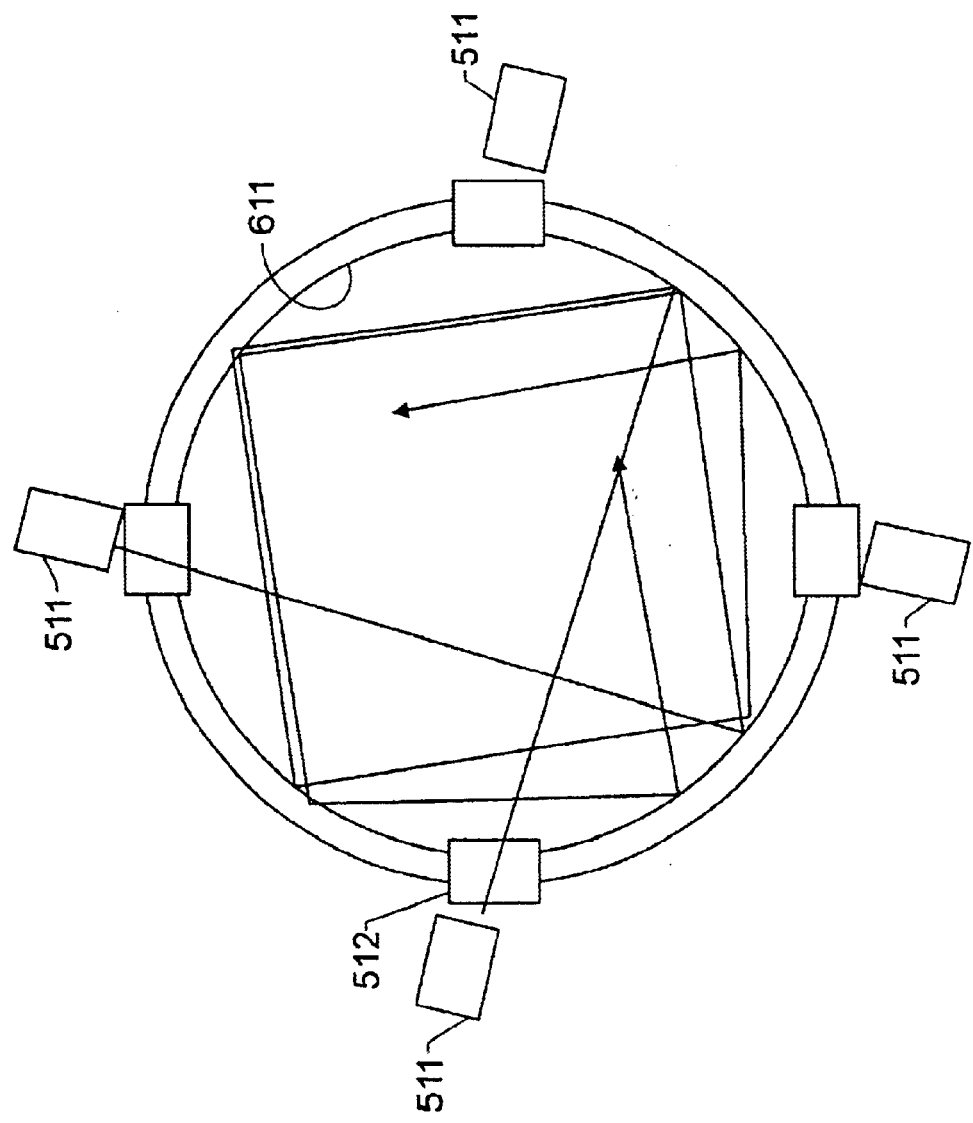
FIG. 6 illustrates a cross-sectional plan view through a portion of the apparatus shown in FIG. 5.

FIG. 6 illustrates a plan view taken from a top of one embodiment (shown in FIG. 5) to illustrate the operation of secondary ionizers 511. It should be understood that secondary ionizers 411, 311, and 211 operate in a analogous manner to that described in FIG. 6.

An important feature in optical ionization in accordance with the present invention is causing the optical energy to interact with a significant number of target atoms in the secondary ionization zone. In accordance with the present invention, a plurality of optical sources 511 are provided and distributed about the periphery of deposition apparatus 500. Quartz windows 512 allow the optical energy from sources 511 to enter deposition apparatus 500. In accordance with the preferred embodiment, a mirrored inner surface 611 is provided in alignment with the path of the optical energy from ionizers 511. The mirrored inner surface 611 causes the optical energy to reflect multiple times within deposition apparatus 500 creating a plane of optical energy which interacts continuously with target atoms that intersect the plane of optical energy.

Preferably ionizers 511 are lasers having a wavelength chosen to selectively ionize the target atoms. Ionizers 511 can be excimer lasers, tuned dye lasers, or other optical energy source capable of supplying sufficient power at a desirable wavelength into chamber 500. Alternatively, ionizers 511 may be ultraviolet or visible light sources focused with conventional lenses (not shown) to fill the secondary ionization zones with optical energy. Ionizers 511 may operate continuously or in pulses depending on the equipment selected.

Although the preferred embodiment illustrates a mirrored inner surface 611, it is possible to form quartz windows 512 as lenses which will bend optical energy 511 into a plane as it enters sputter apparatus 500. Any optical technique that creates sufficient interaction and spreads light from sources 511 sufficiently to create an ionization zone within sputter chamber 500 is adequate in accordance with the apparatus and method of the present invention. Accordingly, these and other obvious modifications are considered equivalent to the specific embodiments shown and described herein.

8. Electrostatic Collimator Design

Figure 7:
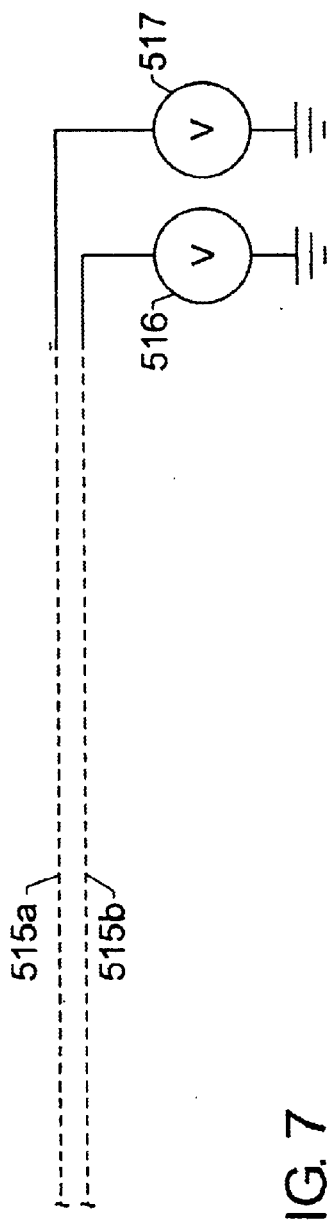
FIG. 7 illustrates in detail an electrostatic collimator shown in FIG. 5.
Figure 8:
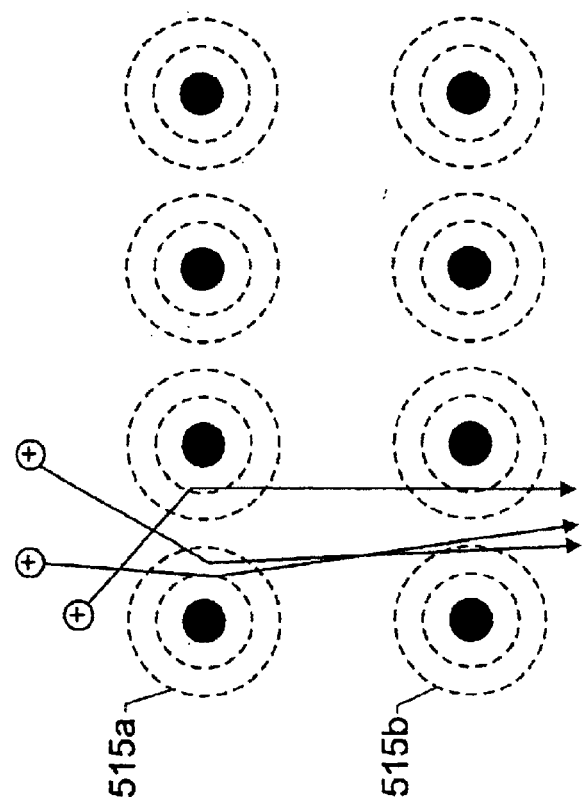
FIG. 8 illustrates a plan view of the electrostatic collimator shown in FIG. 5 and FIG. 7.

FIG. 7 and FIG. 8 illustrate details of electrostatic collimator designs such as electrostatic collimator grids 515a and 515b and electrostatic collimator grids 315a and 315b described hereinbefore. FIG. 8 shows a cross section taken orthogonally from the view shown in FIG. 7. Field lines illustrated by dashed circles in FIG. 8 represent equipotential surfaces in the electrostatic field created by the bias supplied to collimator 515. It should be understood that the equipotential surfaces shown in FIG. 8 are greatly simplified yet are suitable for qualitative understanding of the present invention. The actual field shapes will be more complex due to the interaction of collimator grid 515a and collimator grid 516a.

In the case of accelerating positive target ions, a negative high voltage (i.e., 500 to 5000 volts DC) is supplied by voltage supply 516 and applied to grid 515b. This acts to attract the positive ions toward the grid with high velocity. A relatively low positive voltage (i.e., 50 to 500 volts DC) is supplied by supply 517 simultaneously to collimator grid 515a. The positive ions do not respond to the voltage on collimator grid 515a until they are drawn very near to grid 515a. As positive ions make a near approach to an element of collimator grid 515a, the positive ion is repulsed and deflected toward a center axis between two adjacent elements of collimator grid 515b. Hence, this aspect of the present invention prevents positive ions from physical contact with and deposition on collimator grid 515b. In this manner, the focusing is accomplished by grid 515A and the necessary acceleration is set by grid 515b as illustrated in FIG. 8. The necessary velocity and directionality is achieved by fine tuning of the relative voltages between supplies 516 and 517. The shape and design of the holes in the grids may be varied to increase ion flux and/or increase the ion focusing properties.

It should be appreciated that a number of methods and apparatus for depositing films from highly directional and collimated particle streams are provided. Secondary ionization is used to prolong the lifetime of ionized species in the deposition chamber. Electrostatic collimation is used to accelerate and steer ions to create a collimated stream without deposition onto the collimator. A combination of secondary ionizers with static field steering provides increased directionality and collimation of the particle streams. It is to be expressly understood that the claimed invention is not to be limited to the description of the preferred embodiment but encompasses other modifications and alterations, including those set out as equivalents in hereinbefore, within the scope and spirit of the inventive concept.

We claim:

1. An apparatus for film deposition comprising:
   a deposition chamber;
   a substrate support within the deposition chamber;
   a source of target particles;
   a plasma generator creating a plasma for initially ionizing the target particles that accelerates the target particles along a distribution of trajectories;
   a secondary ionization zone within said deposition chamber between the source and the substrate, the secondary ionization zone comprised of at least one plane of optical energy to promote ionization of the target particles; and
   a magnetic field generator creating a magnetic field between the secondary ionization zone and the substrate support accelerating the ionized target particles along a substantially collimated trajectory perpendicular to the substrate support.

2. The apparatus of claim 1 wherein the source of target particles comprises a sputter target and the plasma generator generates an inert gas plasma that sputters atoms from the sputter target.

3. The apparatus of claim 1 wherein the plasma generator comprises an electron cyclotron resonance heating type plasma generator producing a primary ionization zone adjacent to the source of target particles in which the target particles are ionized.

4. The apparatus of claim 1 wherein the secondary ionization zone is produced by a secondary ionizer which comprises an optical energy source.

5. The apparatus of claim 4 wherein the secondary ionizer comprises a laser.

6. The apparatus of claim 4 wherein the secondary ionizer comprises a laser outputting coherent optical energy into the deposition chamber at a wavelength selected to ionize the target particles preferentially over other components of the plasma.

7. The apparatus of claim 3 wherein the secondary ionization zone is separated from the primary ionization zone by a recombination zone in which the ionized target particles recombime with charged particles to become electrically neutral.

8. The apparatus of claim 1 further comprising a plurality of secondary ionization zones between the source and the substrate support, wherein the target particles are ionized each time they pass through one of the secondary ionization zones.

9. The apparatus of claim 1 wherein the magnetic field generator is positioned between the secondary ionization zone and the substrate support.

10. An apparatus for film deposition comprising:
a deposition chamber;
a source of target particles;
a plasma generator for creating a plasma for initially ionizing the target particles that accelerates the target particles alone a distribution of trajectories;
a secondary ionization zone within the deposition chamber between the source and the substrate support, the secondary ionization zone promoting ionization of the target particles; and
an electrostatic field generator comprising:
a first conductive collimator placed in the target particle trajectories;
a first DC voltage source having a polarity matching that of the ionized target atoms coupled to the first conductive collimator;
a second conductive collimator placed between the firs conductive collimator and the substrate support; and
a second DC voltage source having a polarity opposite that of the ionized target atoms coupled to the second conductive collimator.

11. A method for depositing a film onto a substrate comprising the steps of:
providing a source of target atoms;
accelerating the target atoms from the source towards the substrate, wherein a first plurality of the target atoms are electrically charged to a first polarity,
passing the target atoms through at least one secondary ionization zone positioned between the source and the substrate to electrically charge a second plurality of the target atoms to the first polarity, the second plurality being greater than the first plurality; and
steering the electrically charged target atoms into a collimated stream directed perpendicular to the substrate using an electrostatic field, wherein the step of steering comprises:
providing a conductive collimator grid charged to a second polarity opposite that of the first polarity, the conductive collimator grid located between the source and the substrate; and
generating an electrostatic field having the first polarity between the source and the conductive collimator grid, the electrostatic field having a magnitude and proximity from the conductive collimator grid such that at least some of the electrically charged target atoms are prevented from physical interaction with the conductive collimator grid.

12. The method of claim 11 wherein the step of accelerating comprises sputtering.

13. The method of claim 11 wherein the step of passing comprises the step of:
ionizing the second plurality of target atoms by exposing the target atoms to optical energy at a location spaced from the source of target atoms and spaced from the substrate.

14. The method of claim 13 wherein the optical energy is provided by a laser having a wavelength and power chosen to ionize the target atoms.

15. An apparatus for film deposition comprising:
a deposition chamber;
a substrate support within the deposition chamber;
a source of target particles;
a plasma generator creating a plasma for initially ionizing the target particles that accelerates the target particles along a distribution of trajectories;
a plurality of secondary ionization zones between the source and the substrate support, wherein the accelerated target particles are ionized as they pass through each of the secondary ionization zones; and
a static field generator creating an static field between the secondary ionization zones and the substrate support thereby accelerating the ionized target particles along a substantially collimated trajectory perpendicular to the substrate support, wherein the static field generator comprises:
a first conductive collimator grid placed in the target particle trajectories;
a first DC volt source having a polarity matching that of the ionized target atoms coupled to the first conductive collimator grid;
a second conductive collimator placed between the first conductive collimator grid and the substrate support; and
a second DC voltage source having a polarity opposite that of the ionized target atoms coupled to the second conductive collimator grid.

16. The apparatus of claim 15 wherein the first DC voltage source generates a voltage of lesser magnitude than the second DC voltage source.

17. The apparatus of claim 15 wherein the first DC voltage source generates a voltage in the range of 50–500 volts DC and the second DC voltage source generates a voltage in the range of 500–5000 volts DC.

18. The apparatus of claim 15 wherein the static field generator generates an electrostatic field.

19. The apparatus of claim 15 wherein the static field generator generates a magnetic field.

20. An apparatus for depositing film, said apparatus comprising:
a deposition chamber being adapted to bold a source of target particles and a substrate for receiving said target particles;
a plasma generator for initially ionizing said target particles;
a first secondary optical ionizer for creating a first plane of optical energy positioned to overlie said substrate, said first plane of optical energy ionizing target particles passing through said first plane to said substrate; and
a second secondary optical ionizer for creating a second plane of optical energy positioned to overlie said substrate, said second plane of optical energy ionizing target particles passing through said second plane to said substrate.

21. The apparatus, as set forth in claim 20, wherein said deposition chamber comprises a mirrored inner surface.

22. The apparatus, as set forth in claim 21, wherein said secondary optical ionizer comprises a laser arranged to direct said optical energy onto said mirrored inner surface of said deposition chamber, said mirrored inner surface creating said plane of optical energy.

23. The apparatus, as set forth in claim 20, further comprising:
an electrostatic collimator positioned between said source and said substrate, said collimator directing said target particles toward said substrate.

24. An apparatus for depositing film, said apparatus comprising:
a deposition chamber being adapted to hold a source of target particles and a substrate for receiving said target particles;
a mirror disposed within said deposition chamber;
a plasma generator initially ionizing said target particles; and
a secondary optical ionizer for directing optical energy to said mirror for creating a plane of optical energy positioned to overlie said substrate, said optical energy ionizing target particles passing through said plane to said substrate.

25. The apparatus, as set forth in claim 24, further comprising:
an electrostatic collimator positioned between said source and said substrate, said collimator directing said target particles toward said substrate.

26. An apparatus for depositing film, said apparatus comprising:
a deposition chamber having an inner surface being adapted for reflecting optical energy, said deposition chamber being adapted to hold a source of target particles and a substrate for receiving said target particles;
a plasma generator for initially ionizing said target particles; and
a secondary optical ionizer for directing optical energy to said inner surface of said deposition chamber for creating a plane of optical energy positioned to overlie said substrate, said optical energy ionizing target particles passing through said plane to said substrate.

27. The apparatus, as set forth in claim 26, wherein said inner surface comprises a mirror.

28. The apparatus, as set forth in claim 26, further comprising: an electrostatic collimator positioned between said source and said substrate, said collimator directing said target particles toward said substrate.

29. An apparatus for depositing film, said apparatus comprising:
a deposition chamber being adapted to hold a source of target particles and a substrate for receiving said target particles;
a plasma generator for initially ionizing said target particles;
a secondary ionizer for creating a secondary ionization zone between said source and said substrate, said secondary ionization zone comprised of at least one plane of optical energy to promote ionization of said target particles prior to reaching said substrate; and
a collimator positioned between said source and said secondary ionization zone, said collimator directing said target particles toward said substrate.

30. The apparatus, as set forth in claim 29, wherein said collimator comprises an electrostatic collimator.

31. An apparatus for depositing film, said apparatus comprising:
a deposition chamber being adapted to hold a source of target particles and a substrate for receiving said target particles;
a plasma generator for initially ionizing said target particles;
a secondary ionizer for creating a secondary ionization zone between said source and said substrate, said secondary ionization zone promoting ionization of said target particles prior to reaching said substrate; and
an electrostatic collimator grid positioned between said secondary ionization zone and said substrate, said electrostatic collimator grid directing said target particles toward said substrate.

\* \* \* \* \*